United States Patent [19]
Miller et al.

[11] Patent Number: 5,856,912
[45] Date of Patent: Jan. 5, 1999

[54] MICROELECTRONIC ASSEMBLY FOR CONNECTION TO AN EMBEDDED ELECTRICAL ELEMENT, AND METHOD FOR FORMING SAME

[75] Inventors: Dennis Brian Miller, Barrington; Grace M. O'Malley, Hoffman Estates; Brian R. Kemper, Mount Prospect, all of Ill.

[73] Assignee: Motorola Inc., Schaumburg, Ill.

[21] Appl. No.: 811,561

[22] Filed: Mar. 4, 1997

[51] Int. Cl.⁶ .............................. H05K 7/02; G06K 19/07
[52] U.S. Cl. ...................... 361/737; 235/492; 343/702; 361/764
[58] Field of Search ...................................... 174/255, 260, 174/261; 235/487, 488, 489, 490, 492; 257/679; 307/91; 340/825.44, 311.1; 343/702, 871, 872, 700 MS; 361/212, 220, 684, 686, 737, 753, 755, 780, 794, 800, 799, 818, 814, 764; 379/426, 433, 455, 451; 439/92, 94, 108, 109; 455/90, 106, 269, 348, 351, 300, 303

[56] References Cited

U.S. PATENT DOCUMENTS

| | | |
|---|---|---|
| 4,042,861 | 8/1977 | Yasuda et al. ............................ 361/737 |
| 5,090,119 | 2/1992 | Tsuda et al. . |
| 5,128,746 | 7/1992 | Pennisi et al. . |
| 5,136,365 | 8/1992 | Pennisi et al. . |
| 5,241,133 | 8/1993 | Mullen, III et al. . |
| 5,278,726 | 1/1994 | Brenardoni et al. . |
| 5,285,352 | 2/1994 | Pastore et al. . |

*Primary Examiner*—Donald Sparks
*Attorney, Agent, or Firm*—Douglas D. Fekete; John MacIntyre

[57] ABSTRACT

A microelectronic assembly (10) is formed by attaching a component subassembly (34) to a substrate (12). The substrate (12) includes a face (26) and defines a via (28) having a via opening (30) at the face (26). The substrate (12) further defines a component cavity (32) at the face (26). An electrical element (14) is disposed within the substrate (12) and includes a terminal (24) at the via (28). The component subassembly (34) is formed by mounting an integrated circuit component (16) onto a metallic lead (18). The integrated circuit component (16) is electrically connected to the metallic lead (18) by a wire lead (36). A leg (20) is formed by deforming a portion of the metallic lead (18). A polymeric body (56) is formed about the component (16) and wire leads (36). The component subassembly (34) is superposed onto the substrate (12), and the component (16) is received in the component cavity (32). The metallic lead (18) is affixed to the face (26). The leg (20) extends into the via (28) and contacts a conductive body (22) within the via (28). The conductive body (22) electrically connects the leg (20) and the terminal (24).

17 Claims, 1 Drawing Sheet

MICROELECTRONIC ASSEMBLY FOR CONNECTION TO AN EMBEDDED ELECTRICAL ELEMENT, AND METHOD FOR FORMING SAME

FIELD OF THE INVENTION

This invention relates generally to a microelectronic assembly, such as a smart card, that includes an integrated circuit component mounted to a substrate and connected to an electrical element embedded therein. More particularly, this invention relates to such an assembly wherein the component is mounted to a metallic lead that includes a leg that is deformed to extend into a via to make a connection to an embedded electrical element.

BACKGROUND OF THE INVENTION

Microelectronic assemblies include integrated circuit components attached to substrates. Electrical interconnections are formed that allow communication between the integrated circuit component and the substrate for sending and receiving signals for processing. One type of a microelectronic assembly is a "smart card" assembly.

"Smart card" assemblies are credit-card-sized assemblies that include an integrated circuit component attached to a substrate. The integrated circuit component contains information, such as access privileges, account balances, and security information. Smart card assemblies typically include a plurality of electrical contacts on the surface of the smart card that permit electrical access to information stored in the integrated circuit component. The integrated circuit component is attached to the electrical contacts.

Contactless cards have been developed to allow utilization of the card without having to make physical contact with a mechanical reader head, thereby making the contactless cards faster to use and their functionality more transparent to the user. An antenna is typically disposed within the card to receive a signal transmitted from a base unit and to transmit a signal back to the base unit. In a contactless card, the integrated circuit component is typically embedded in the substrate, and is not attached to metal contacts on the surface of the card. In this manner, the position of the integrated circuit component is not based upon a need to be attached to metal contacts exposed at the surface of the card.

It is desired to form a microelectronic assembly that includes the functionality of both the contact card and the contactless card. Such dual interface "smart cards" include both contact pads on the surface of the card and contactless capabilities.

It has been difficult to achieve acceptable results with dual interface "smart cards". The process of connecting the embedded antenna to the integrated circuit component that has been attached to the external contacts has been difficult to achieve reliably. One proposed solution has been to include two integrated circuit components within each "smart card", one for the contact function and one for the contactless function. However, this approach leads to a more expensive smart card and a more complicated manufacturing process.

Therefore, a need exists for a microelectronic assembly that is able to be manufactured in an inexpensive, reliable way that incorporates the functions of both contact and contactless cards without the need for multiple integrated circuit components.

DETAILED DESCRIPTION OF A PREFERRED EMBODIMENT

The present invention provides a microelectronic assembly formed by attaching a component subassembly to a substrate. The substrate is preferably formed by laminating polymeric layers about an electrical element, such as an antenna. The substrate includes a face and defines a via that has an opening at the face and further defines a component cavity at the face. The electrical element disposed within the substrate includes a terminal at the via that provides electrical interconnection to the electrical element.

The component subassembly is formed by attaching an integrated circuit component to a lead frame that includes metallic leads. The integrated circuit component is bonded to the lead frame, and an electrical interconnection is formed between the integrated circuit component and the metallic leads, preferably by wire bonding. A polymeric body is formed over the integrated circuit component and the wire bonds. In accordance with this invention, a leg is formed and is dependent from the metallic lead and extends into the via.

The component subassembly is then superposed onto the substrate to form a microelectronic assembly. The metallic lead is affixed to the substrate face. The leg extends into the via into contact with a conductive body within the via. The conductive body electrically connects the leg and the terminal, thereby electrically connecting the integrated circuit component and the terminal to form an integral microelectronic assembly.

Figure 1:
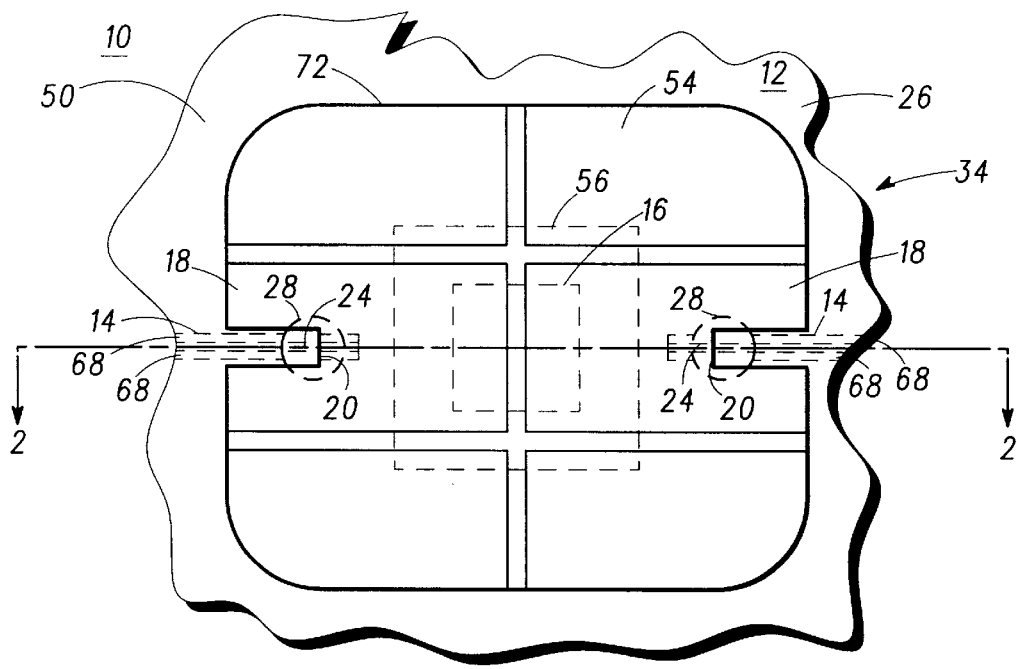
FIG. 1 is a top plan view of a microelectronic assembly in accordance with a preferred embodiment of the present invention.
Figure 2:
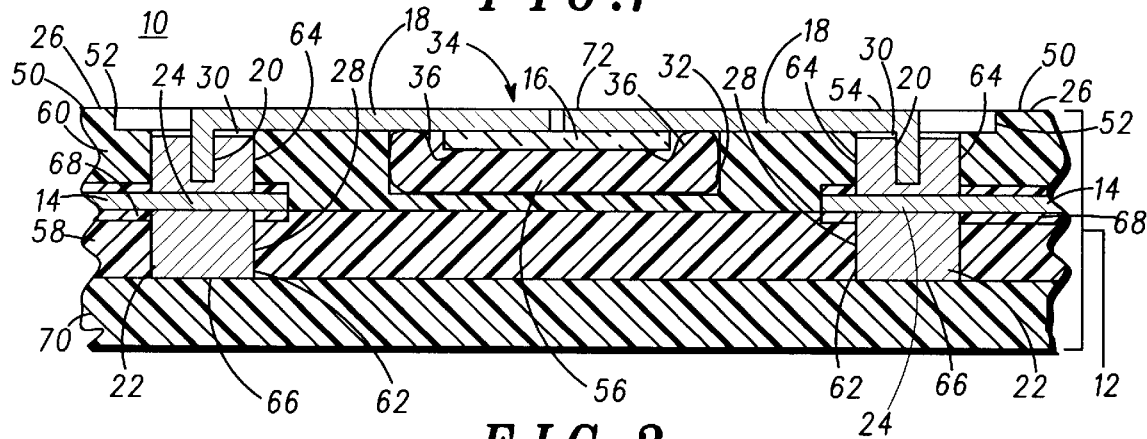
FIG. 2 is a cross-sectional view of the microelectronic assembly in FIG. 1 taken along line 2—2 and including an integrated circuit component and a metallic lead over a substrate.
Figure 3:
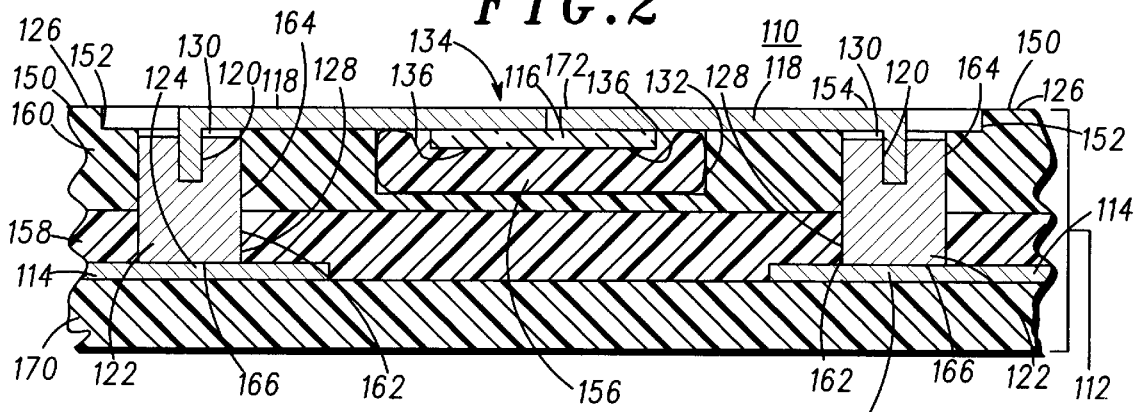
FIG. 3 is a cross-sectional view of a microelectronic assembly formed in accordance with an alternate embodiment of the present invention.

The present invention can be better understood with reference to FIGS. 1–3 In accordance with a preferred embodiment of this invention, FIG. 1 depicts a lead frame 72 that includes metallic leads 18. Metallic leads 18 are deformed, by bending or the like, to form legs 20. Legs 20 dependently extend from leads 18 to facilitate electrical connection to leads 18.

In accordance with a preferred embodiment of this invention, FIG. 2 depicts a cross-sectional view of a microelectronic assembly 10. Assembly 10 comprises a substrate 12 and a component subassembly 34. Substrate 12 preferably comprises a first polymeric layer 58 laminated to a second polymeric layer 60. Substrate 12 is generally formed of multiple layers of a polymeric material laminated together to form an integral layer of a desired thickness. In a preferred embodiment, substrate 12 is formed of three layers 58, 60, and 70, and further includes two protective outer layers. Alternately, a protective coating may be applied to layers 60 and 70.

First polymeric layer 58 is formed on bottom polymeric layer 70 and defines a first via 62, preferably formed by a punching process. In a preferred embodiment, an electrical element 14 is formed on first layer 58. Element 14 is preferably an antenna formed by winding an insulated copper wire on the surface of layer 58. Element 14 is preferably formed of an insulated metallic wire comprising a metal core surrounded by an insulating coating. Alternately, element 14 may be a conductive trace, a jumper trace, a capacitor, a resistor, or any electrical element able to send or receive electrical signals. Electrical element 14 includes a terminal 24 overlying first via 62.

A second polymeric layer 60 is formed on electrical element 14 and first polymeric layer 58. Layer 60 is preferably formed of the same material as layers 58 and 70. Suitable polymers for layers 58, 60, and 70 include polyvinyl chloride (PVC), acrylonitrile-butadiene-styrene (ABS), polycarbonate (PC), polypropylene sulfate (PPS), or polyester (PET). A second via 64 is formed in layer 60, such that second via 64 aligns with first via 62 to form via 28. Second via 64 is formed by a controlled-depth milling process. In the milling process, material of layer 60 is removed, but terminal 24 is not adversely affected. Alternately, an intermediate polymeric layer may be formed on first layer 58 that includes a punched via that aligns with first via 62. Second layer 60 is then formed on the intermediate layer, and is milled to the punched via in the intermediate layer. In this manner, the depth of the milling does not need to be as precisely controlled, and terminal 24 is not contacted by the milling machinery.

Substrate 12 thereby defines via 28 formed of first via 62 in communication with second via 64. Via 28 includes a via bottom 66 remote from via opening 30. Substrate 12 includes a face 26 opposite first polymeric layer 58. Via 28 includes a via opening 30 at face 26. In a preferred embodiment, insulating coating 68 is removed within via 28 to expose terminal 24. Removing the coating facilitates formation of an electrical interconnection between integrated circuit component 16 and electrical element 14. In this manner, the copper wire is exposed in via 28, but is insulated outside of via 28.

Component cavity 32 is formed in substrate 12, and is preferably spaced apart from via 28. Component cavity 32 is sized and shaped to receive integrated circuit component 16 and polymeric body 56. Metallic lead 18 is preferably formed of a metallic plate having a generally planar outer surface 54. Recess 52 is formed in face 26 to receive lead frame 72 and metallic lead 18. In a preferred embodiment, substrate 12 includes a perimeter 50 that is substantially planar about recess 52. Upon attachment of lead frame 72 and metallic lead 18 to substrate 12, lead outer surface 54 forms a generally planar surface with perimeter 50.

Integrated circuit component 16 is attached to metallic lead 18 with an epoxy or other adhesive. Integrated circuit component 16 includes an active face that includes a bond pad and a non-active face opposite the active face. Integrated circuit component 16 is suitably an integrated circuit die. A component wire lead 36 is formed between the bond pad on component 16 and metallic lead 18 to electrically connect component 16 to lead 18. Wire lead 36 is preferably formed by a wire bonding process.

Component 16 and wire leads 36 are then encapsulated within polymeric body 56. Polymeric body 56 is preferably a polymeric transfer mold, but can alternately be a liquid thermoset encapsulant that is subsequently cured to form polymeric body 56.

Leg 20 is dependent from generally planar metallic lead 18. Leg 20 is preferably formed by bending a portion of metallic lead 18, and is substantially perpendicular to metallic lead 18. Accordingly, subassembly 34 includes integrated circuit component 16 attached to metallic leads 18, wire leads 36 that electrically connect component 16 to metallic lead 18, a polymeric body 56 about component 16, wire leads 36, and legs 20 extending from metallic leads 18.

A bonding agent is dispensed into via 28. Bonding agent is a conductive material, such as a solder paste or a conductive resin formed of metallic particles dispersed in a polymeric matrix The bonding agent is dispensed into via 28 through via opening 30 to surround terminal 24. The bonding agent may be disposed by screen printing, syringe dispensing, jetting, or the like.

Component subassembly 34 is then superposed onto substrate 12 to form a preassembly. A nonconductive adhesive is applied to secure component subassembly 34 to substrate 12. Legs 20 extend into vias 28 and contacts the bonding agent in via 28.

The preassembly is then heated to coalesce the bonding agent to form a conductive body 22 that both electrically and physically attaches terminal 24 to leg 20. Conductive body 22 is then solidified by cooling to connect terminal 24 to leg 20. In this manner, electrical signals may be transmitted between electrical element 14 and integrated circuit component 16 for processing. The heating step can also concurrently laminate layers 58 and 60 to form an integral polymeric layer.

In an alternate embodiment, as depicted in FIG. 3, a substrate 112 is formed in a similar manner to the preferred embodiment. Electrical element 114 is formed on bottom polymeric layer 170. This may be done by plating, etching, conductive ink printing, foil lamination, lead frame forming, or the like. As in the preferred embodiment, first polymeric layer 158 and second polymeric layer 160 are then formed on first layer 158, and a second via 164 is formed therein.

Component subassembly 134 is also formed in a manner similar to the preferred embodiment. Subassembly 134 is superposed onto substrate 112, such that legs 120 extend into vias 128 through openings 130 and contact the bonding agent dispensed in vias 128. The preassembly is then heated to bond leg 120 to terminal 124 to form an integral microelectronic assembly 110.

Thus, the present invention provides a microelectronic assembly that is formed by mounting a component subassembly onto a substrate. The substrate includes an electrical element, such as an antenna, that includes a terminal exposed in the via. The via is filled with a bonding agent, and the integrated circuit component is superposed onto the substrate. Legs dependent from the metallic lead extend into the via and contact the bonding agent. The bonding agent is then bonded to the leg and the terminal to form a conductive body that physically and electrically connects the terminal and the leg.

The present invention thereby provides a microelectronic assembly, such as a smart card assembly, that is reliable and easy to manufacture. The legs are formed inexpensively by bending a portion of the metallic lead, thereby incurring no additional material cost for forming the interconnection. Further, the bonding of the metallic lead provides a strong mechanical protrusion that is able to reliably extend into the bonding agent without deforming to provide a reliable interconnection. Further, an assembly is formed that includes the functionality of both a contact card and a contactless card into an integral assembly while using a single Integrated circuit component.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A microelectronic assembly comprising:
   a substrate having a face and defining a via having a via opening at the face and further defining a component cavity at the face;
   an electrical element disposed within the substrate and comprising a terminal at the via;

an integrated circuit component received in the component cavity;

a metallic lead overlying the face between the component cavity and the via and electrically connected to the integrated circuit component, said metallic lead comprising a leg dependent from the metallic lead and extending into the via; and a conductive body within the via electrically connecting the leg and the terminal.

2. A microelectronic assembly in accordance with claim 1, wherein the conductive body is composed of a solder alloy metallurgically bonded to the leg and the terminal.

3. A microelectronic assembly in accordance with claim 1, wherein the conductive body is composed of metallic particles dispersed in a polymeric matrix.

4. A microelectronic assembly in accordance with claim 1, wherein the integrated circuit component comprises a wire lead having an end bonded to the metallic lead.

5. A microelectronic assembly comprising:

a substrate formed of polymeric laminate and having a face, said substrate defining a via having a via opening at the face and further defining a component cavity at the face spaced apart from the via, said substrate further comprising an antenna disposed within the substrate and comprising a terminal at the via;

an integrated circuit component received in the component cavity;

a metallic lead affixed to the face, said metallic lead being electrically connected to the integrated circuit component, said metallic lead comprising a leg dependent from the metallic lead and extending into the via; and a conductive body within the via electrically connecting the leg and the terminal.

6. A microelectronic assembly in accordance with claim 5, wherein the leg extends away from the metallic lead in a direction generally toward the terminal within the via.

7. A microelectronic assembly in accordance with claim 5, wherein the conductive body is composed of a solder alloy metallurgically bonded to the leg and the terminal.

8. A microelectronic assembly in accordance with claim 5, wherein the conductive body is composed of metallic particles dispersed in a polymeric matrix.

9. A microelectronic assembly in accordance with claim 5, wherein the face comprises a generally planar perimeter and a recess, and wherein the metallic lead is formed of a metallic plate having a generally planar outer surface and is received in the recess such that the generally planar outer surface is coextensive with the generally planar perimeter.

10. A microelectronic assembly in accordance with claim 5, wherein the integrated circuit component comprises an integrated circuit die.

11. A microelectronic assembly comprising:

a substrate formed of polymeric laminate and having a face, said substrate defining a recess, a via having a via opening at the face, and a component cavity at the face spaced apart from the via;

an antenna disposed within the substrate and comprising a terminal at the via;

an integrated circuit component received in the component cavity;

a metallic lead affixed to the face, said metallic lead being electrically connected to the integrated circuit component and formed of a metallic plate that is received in the recess, said metallic lead including a leg dependent from the metallic lead and extending substantially perpendicular to the metallic lead into the via; and a conductive body within the via electrically connecting the leg and the terminal.

12. A microelectronic assembly in accordance with claim 11, wherein the integrated circuit component further comprises an active face including a bond pad, a non-active face affixed to the metallic lead, and a wire lead attached to the bond pad and the metallic lead.

13. A microelectronic assembly in accordance with claim 12, wherein the integrated circuit component is formed by molding a polymeric body about an integrated circuit die and the wire lead.

14. A microelectronic assembly in accordance with claim 11, wherein the metallic lead partially overlies the component cavity.

15. A microelectronic assembly in accordance with claim 11, wherein the antenna is formed of a metallic wire.

16. A microelectronic assembly in accordance with claim 11, wherein the substrate comprises at least two polymeric layers, and wherein the antenna is interposed between the at least two polymeric layers and bridges the via.

17. A microelectronic assembly in accordance with claim 11, wherein the via has a via bottom remote from the via opening and wherein the terminal bridges the via and the conductive body encircles the terminal.

* * * * *